(12) United States Patent
Kumar et al.

(10) Patent No.: US 12,354,656 B2
(45) Date of Patent: Jul. 8, 2025

(54) REDUCING MEMORY DEVICE BITLINE LEAKAGE

(71) Applicant: Synopsys, Inc., Mountain View, CA (US)

(72) Inventors: Shishir Kumar, Greater Noida (IN); Vinay Kumar, Aligarh (IN)

(73) Assignee: Synopsys, Inc., Sunnyvale, CA (US)

( * ) Notice: Subject to any disclaimer, the term of this patent is extended or adjusted under 35 U.S.C. 154(b) by 161 days.

(21) Appl. No.: 17/955,790

(22) Filed: Sep. 29, 2022

(65) Prior Publication Data
US 2024/0038300 A1 Feb. 1, 2024

(30) Foreign Application Priority Data
Aug. 1, 2022 (IN) .............................. 202241043893

(51) Int. Cl.
*G11C 11/00* (2006.01)
*G11C 13/00* (2006.01)
(52) U.S. Cl.
CPC ...... *G11C 13/0028* (2013.01); *G11C 13/0026* (2013.01); *G11C 13/004* (2013.01)
(58) Field of Classification Search
CPC ................................................. G11C 13/0002

USPC ......................................................... 365/148
See application file for complete search history.

(56) References Cited

U.S. PATENT DOCUMENTS

| 4,775,958 A * | 10/1988 | Hashimoto ............ G11C 16/26 365/185.11 |
| 6,144,584 A * | 11/2000 | Kunori .................... H10B 69/00 365/185.23 |
| 2012/0081946 A1* | 4/2012 | Kawabata .......... G11C 13/0007 365/148 |

* cited by examiner

*Primary Examiner* — Hoai V Ho
(74) *Attorney, Agent, or Firm* — Fenwick & West LLP

(57) ABSTRACT

A memory device includes a plurality of select lines, a plurality of word lines, an array of memory cells, a bitline, and a resistance device. The array of memory cells includes multiple rows and multiple columns. The bitline is structured to receive a current in a read operation, causing a value stored in a selected memory cell to be readable when a select line and a word line that interest the selected memory cell are selected. The resistance device has a first terminal and a second terminal. The first terminal is coupled to the select lines, and the second terminal is coupled to ground. The resistance device is structured to bias, in the read operation, word lines of unselected memory cells in a column of a selected memory cell to a determined negative voltage.

20 Claims, 8 Drawing Sheets

| trim<1> | trim<0> | Resistance |
|---|---|---|
| 1 | 1 | R |
| 1 | 0 | 2R |
| 0 | 1 | 3R |
| 0 | 0 | 4R |

…

REDUCING MEMORY DEVICE BITLINE LEAKAGE

RELATED APPLICATION

This application claims the right of priority based on India Provisional Patent Application Serial No. 202241043893, entitled "Reducing Memory Device Bitline Leakage", filed Aug. 1, 2022, which is incorporated by reference in its entirety.

TECHNICAL FIELD

The present disclosure relates to memory devices. In particular, the present disclosure relates to a memory device and a method for reducing bitline leakage during a read operation.

BACKGROUND

Generally, a memory device (e.g., a memory chip) includes a memory cell array, a peripheral circuit, and an input/output (I/O) interface circuit. A memory cell array includes a matrix of $2^N$ rows and $2^M$ columns that can store binary information of $2^{N+M}$ bits. For random access memory (RAM), any cell can be accessed at random with the same speed by selecting both the corresponding row and column. Sometimes, the memory cell array is also referred to memory cell matrix, a memory array, or simply an array. Each row has a word line (WL). Each column has a bitline (BL) and a select line (SL). When a WL of a particular row and an SL of a particular column are selected, a bit of data can be read from a given bitline that intersects the SL.

Traditional RAM includes dynamic random-access memory (DRAM), static random-access memory (SRAM), and flash memory. In general, DRAM, SRAM, and flash are all charge storage-based memories. For example, DRAM stores charge at capacitors, SRAM stores charge at nodes of cross-coupled inverters, and flash memory stores charge at floating gates of transistors. Scaling these technologies to a 10 nanometer (nm) node or under is complex and costly and has been difficult to achieve.

SUMMARY

Disclosed includes a memory device having reduced bitline leakage and a method for reducing bitline leakage on a memory device. The memory device includes multiple select lines multiple word lines, multiple memory cells, a bitline, and a resistance device. The multiple memory cells have multiple rows and columns. The bitline is structured to receive a current in a read operation, causing a value stored in a selected memory cell to be readable when a select line and a word line that intersect the selected memory cell are both selected. The resistance device has a first terminal and a second terminal. The first terminal of the resistance device is coupled to each of the plurality of select lines, and the second terminal of the resistance device is coupled to ground. The resistance device is structured to bias, in the read operation, word lines of unselected memory cells in a column of a selected memory cell to a determined negative voltage.

In some embodiments, the memory device is a resistance based memory device that depends upon changes of resistance to store values in memory cells. In some embodiments, the memory device is one of (i) a phase change memory (PCM), (ii) a magnetoresistive random access memory (MRAM), or (iii) a resistive random access memory (RRAM).

In some embodiments, each memory cell includes a MOS transistor and a variable resistor. The MOS transistor has a gate terminal, a source terminal, and a drain terminal. The variable resistor having a first terminal and a second terminal. The gate terminal of the MOS transistor is connected to a corresponding word line, the drain terminal of the MOS transistor is connected to the first terminal of the variable resistor, the source terminal of the MOS transistor is connected to the select line, and the second terminal of the variable resistor is connected to the bitline. The resistance device causes a voltage of the select line to be raised to a determined voltage (+V), which in turn causes a voltage between the gate terminal and the source terminal of the MOS transistor to be the determined negative voltage (−V).

Disclosed also includes a non-transitory computer readable medium comprising instructions, which when executed by a processing device, cause the processing device to instantiate a digital representation of a memory device, similar to the memory device described above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

A new class of memory, which depends upon the change of resistance rather than charge to store information, has begun to emerge in an effort to drive towards sub 10 nm nodes. Such memory (hereinafter also referred to as resistance-based RAM) includes (but is not limited to) (i) phase change memory (PCM), (ii) magnetoresistive random access memory (MRAM), and (iii) resistive random access memory (RRAM).

Resistance-based RAM depends upon a change of resistance to store information. When a read operation is performed at a resistance-based RAM, the select line (SL) is held at ground, and a current is injected on the bitline (BL). In some existing resistance-based RAM, the current injected on the BL causes all of the cells (including the selected and unselected cells) in a whole column to consume power, even though only one cell is selected. The power consumed or leaked by the unselected cells results in less power being supplied to the selected cell, especially in high temperatures. The higher the temperature, the more leakage may occur. For example, experimental data shows when the temperature is at 150 Celsius degrees, a current of 50 µA is injected on the BL of a column of memory cells having 1024 cells, a current of 28.5 µA is leaked through unselected 1023 cells, resulting in a current of only 21.5 µA flows through the selected cell. When so much power is leaked through the unselected cells, the performance of read operations on the selected cell deteriorates.

One solution for solving the above problem is to implement a charge pump to hold a WL to a negative voltage for unselected cells in a column of the selected cell during a read operation. This solution requires a design of a charge pump into the memory chip. Incorporating a charge pump design causes a significant increase in the cost of the memory chip and requires significant additional chip space for integration.

To address the above challenges, the disclosed configuration includes incorporation of a resistance device on the SL, creating a potential on SL configured to bias WLs of unselected cells. The resistance device approach reduced design complexity and costs, while resulting in similar or even better results. For example, implementation of the resistance device on the SL significantly reduces leakage and removes requirement of complex charge pump thus leading to better area and performance.

Figure 1:
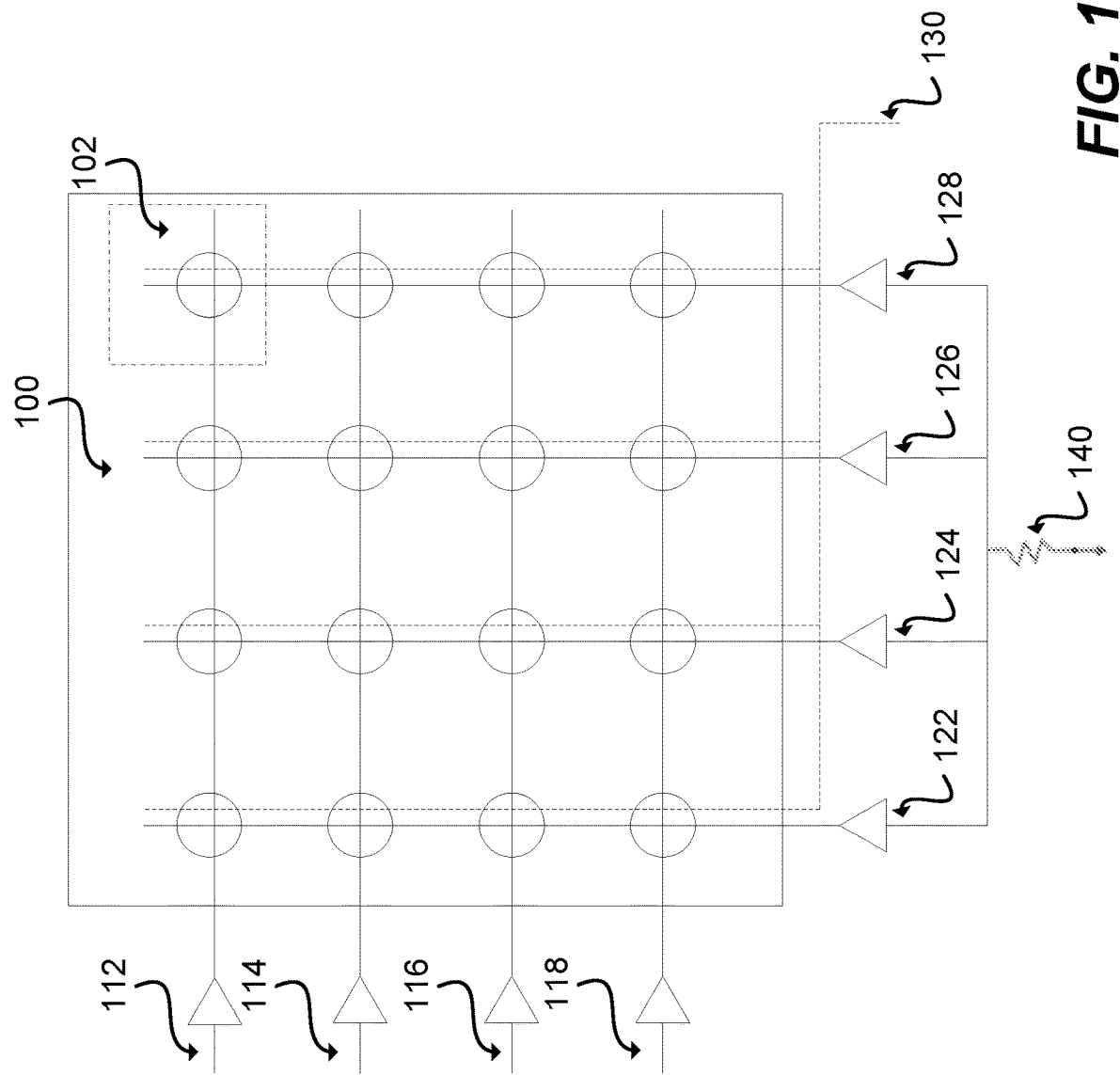
FIG. 1 illustrates an example of a resistance-based memory array according to one embodiment.

FIG. 1 illustrates an example memory array 100 of a resistance based memory device according to one embodiment, including a matrix of 4 ($=2^2$) rows and 4 ($=2^2$) columns that can store binary information of 16 ($=2^{2+2}$) bits. Any cell 102 can be accessed at random with the same speed by selecting both the corresponding row and column. Each row is connected to a word line (WL) 112, 114, 116, or 118. Each column is connected to a select line (SL) 122, 124, 126, or 128 and a bitline (BL) 130. When an SL of a particular column (e.g., SL 128) and a WL of a particular row (e.g., WL 112) are both selected, a bit stored in a cell (e.g., cell 102) that intersects both the selected SL and WL can be read from the BL 130. Further, to reduce current leakage from the unselected cells, a resistance device 140 is placed between ground and the select lines 122, 124, 126, and 128.

Figure 2:
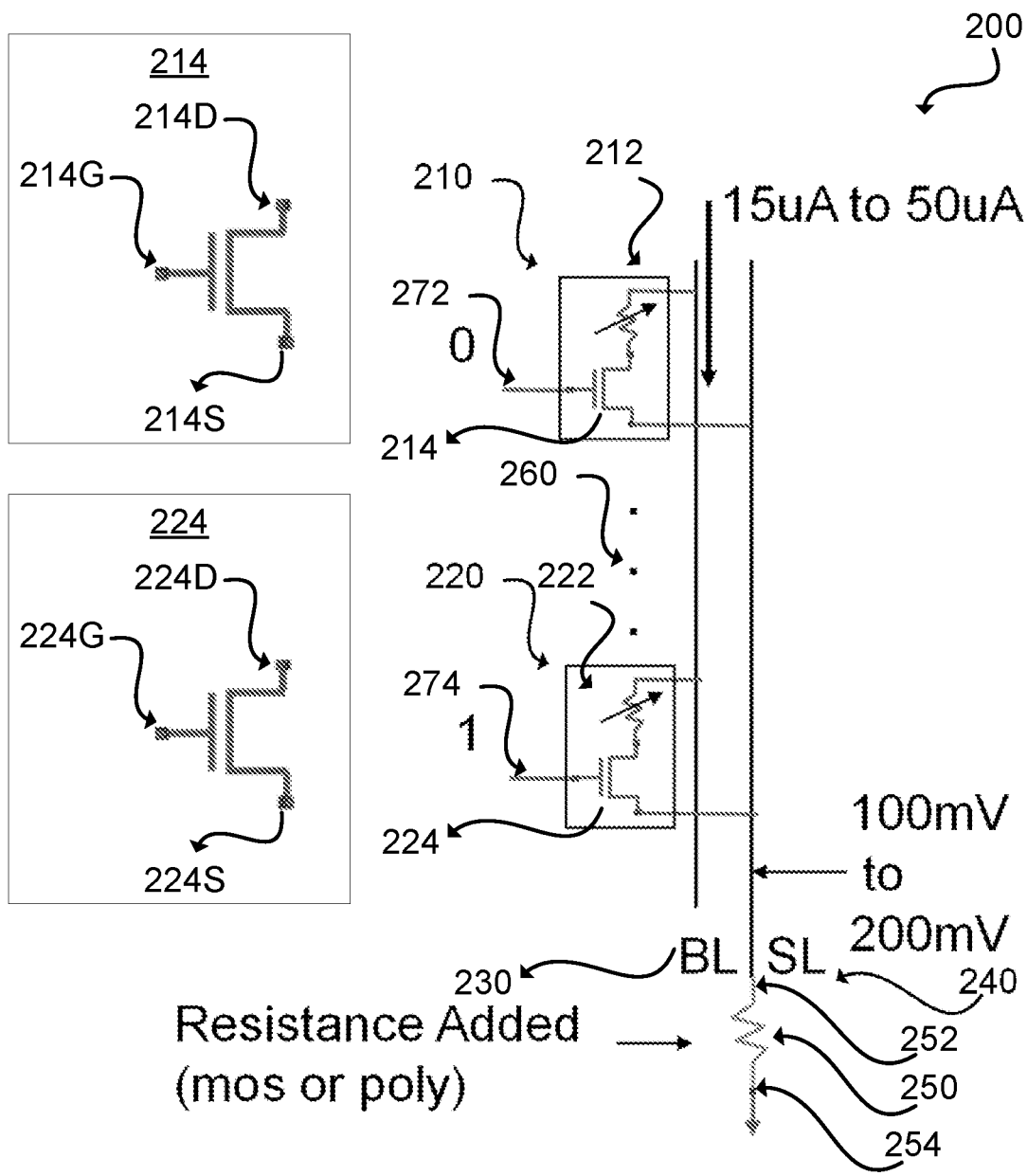
FIG. 2 illustrates an enlarged view of a column of a memory array that has been selected according to one embodiment, which may correspond to any column of the memory array of FIG. 1.

FIG. 2 illustrates an enlarged view of a column 200 of a memory array that has been selected according to one embodiment, which may correspond to any column of memory array of FIG. 1. The column 200 includes a plurality of cells, e.g., cells 210, 220. Further, BL 230 corresponds to the BL 130 of FIG. 1, SL 240 corresponds to SL 122, 124, 126, or 128 of FIG. 2, and resistance device 250 corresponds to resistance device 140 of FIG. 1. The ellipsis 260 represents that there may be any number of cells in the column.

As illustrated, in the embodiment, each cell includes a MOS (metal-insulator-semiconductor) transistor and a variable resistor. Each MOS transistor includes a gate terminal, a source terminal, and a drain terminal. For example, cell 210 includes a MOS transistor 214 and a variable resistor 212; cell 220 includes a MOS transistor 224 and a variable resistor 222. The MOS transistor 214 includes a gate terminal 214G, a source terminal 214S, and a drain terminal 214D. The MOS transistor 224 includes a gate terminal 224G, a source terminal 224S, and a drain terminal 224D.

The source terminal 214S, 224S of the MOS transistor 214, 224 is connected to the SL 240, which is then connected to a terminal 252 of the resistance device 250. Another terminal 254 of the resistance device 250 is connected to ground. One terminal of the variable resistor 212, 222 is connected to a drain terminal 214D, 224D of the corresponding MOS transistor 214, 224, and another terminal of the variable resistor 212, 222 is connected to BL. The gate terminal 214G, 224G of each MOS transistor 214, 224 is connected to a WL 272, 274, which may correspond to WL 112, 114, 116, or 118 of FIG. 1). When a row is selected, the gate of the corresponding MOS transistor is turned on. For example, the "1" near the WL 272 of the MOS transistor 224 indicates that a row corresponding to the MOS transistor 224 is selected, as such the MOS transistor 224 is turned on; and the "0" near the WL 274 of the MOS transistor 214 indicates that a row corresponding to the MOS transistor 214 is unselected, as such the MOS transistor 214 is turned off.

During a read operation, a current of about 15 microamps (µA) ($=10^{-6}$ amperes) to 50 µA is injected into the BL 230, and the terminal 254 of the resistance device 250 is held at ground. The resistance device 250 causes a voltage of the SL 240 to be raised by about 100 millivolts (mV) to 200 mV, which in turn causes the voltage (Vgs) between the gate terminal 214G and source terminal 214S of the MOS transistor 214 of the unselected cell 210 to be biased at about negative 100 mV (−100 mv) to negative 200 mV (−200 mV). Since the gate terminal 214G is connected to a corresponding WL 272 of the row, the corresponding WL 272 is biased by the Vgs, such that power leakage from the unselected cell(s) 210 is significantly reduced.

The disclosed configuration includes a resistance device 250 that not only reduces power leakage of unselected cells, but also has benefits over implementation of a charging pump. For example, for a column of 1024 ($=2^{10}$) cells, a current of 50 µA is injected into a BL: (1) when the Vgs is not lowered, a leakage of 1023 cells is about 28.5 µA, resulting in only a current of 21.5 µA supplied to a selected cell; (2) when a charging pump is implemented to reduce Vgs to −200 mV, a leakage of 1023 cells is reduced to 1.16 µA, resulting in a current of 48.84 µA supplied to the selected cell; and (3) a resistance device having a resistance of about 4000 Ohm ($\Omega$) is implemented at the SL, a leakage of 1023 cells is reduced to 0.7 µA, resulting in a current of 49.28 µA supplied to the selected cell. Notably, the implementation of the resistance device according to the embodiments described herein (reducing the leakage to 0.7 µA) is not only much simpler and less expensive compared to that of a charging pump (reducing the leakage to 1.16 µA), but also provides a much better result.

In example embodiments, the resistance device 250 is a device that has a resistance character, though it is not required to be a resistor. For example, in some embodiments, the resistance device 250 may include (but is not limited to) one or more resistors, one or more a metal-insulator-semiconductor (MOS) transistors, polycrystalline silicon (Poly) transistors, oxide diffusion (OD) areas, nanowire (NW) transistors, and/or a combination thereof.

Figure 3A:
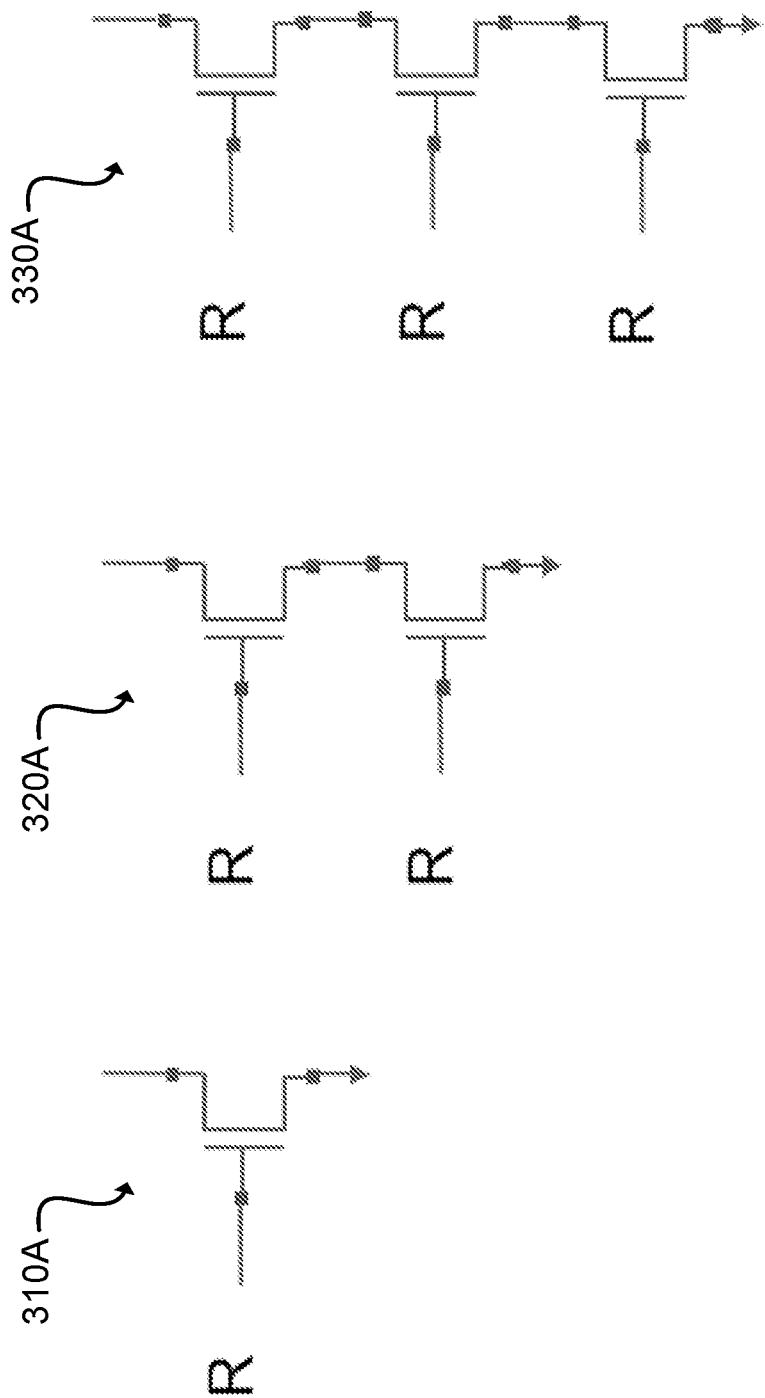
FIGS. 3A-3C illustrate a few example embodiments of using one or more transistors and/or resistors to form a resistance device.
Figure 3B:
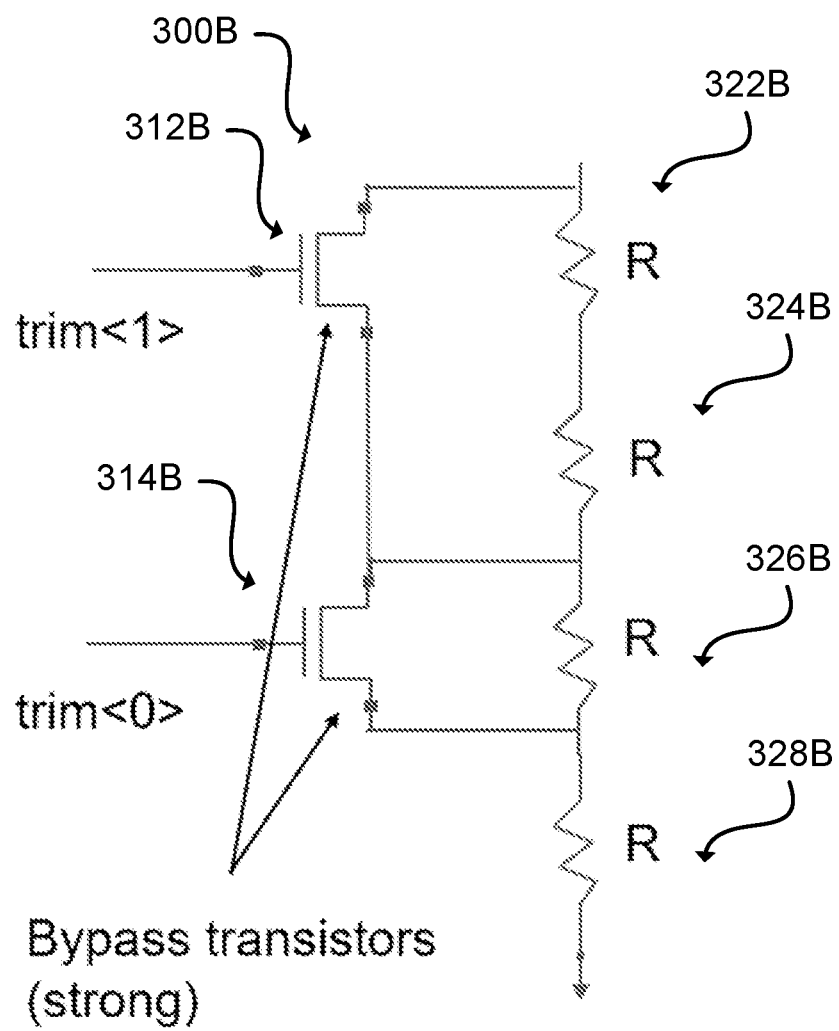
Figure 3C:
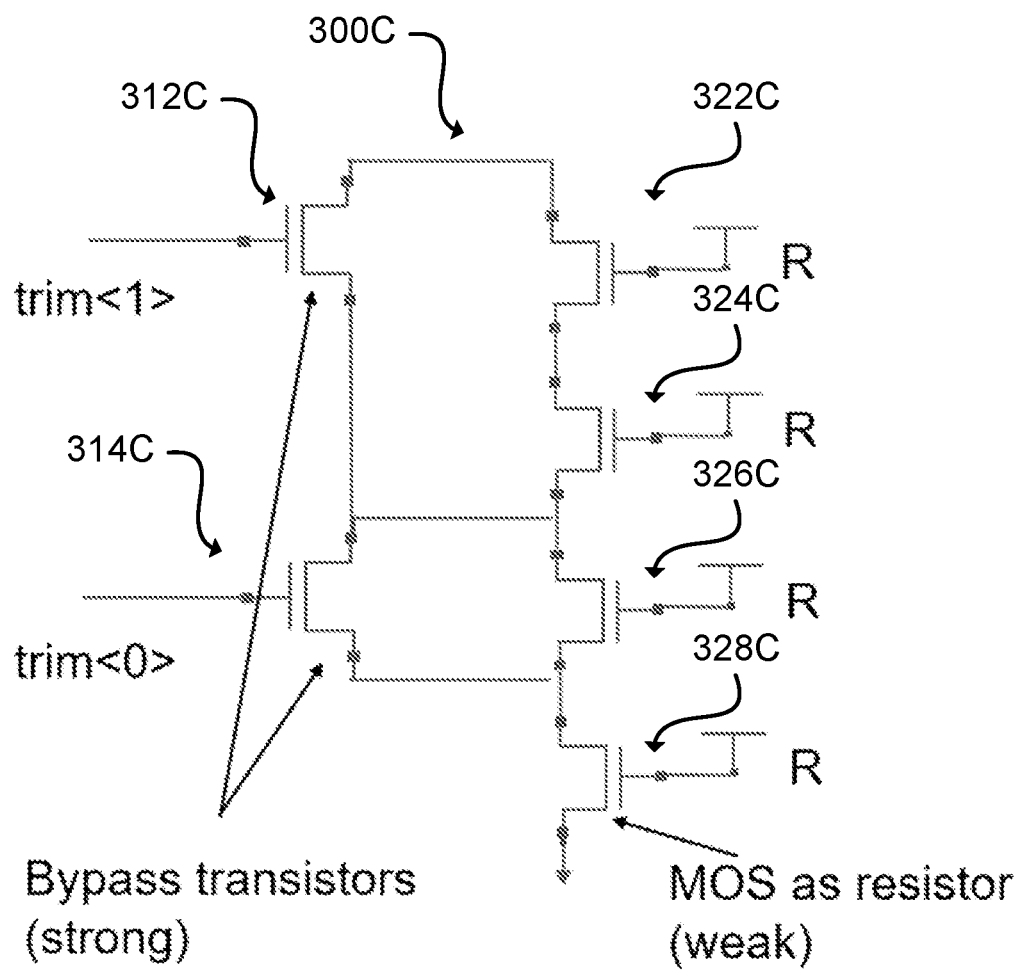

FIGS. 3A-3C illustrate different embodiments of using various transistors and/or resistors to form resistance devices according to some embodiments.

FIG. 3A illustrates a few examples of resistance devices 310A, 320A, and 330A using one or more MOS transistors as resistors according to the principles described herein. For example, in embodiment 310A, a single transistor having a resistance R is used as the resistance device 250; in embodiment 320A, two transistors each having a resistance R is used as the resistance device 250, causing the resistance device 320A to have a total resistance 2R; and in embodiment 330A, three transistors each having a resistance R is used as the resistance device 250, causing the resistance device 330A to have a total resistance 3R. In general, any number of transistors having any resistance may be implemented to achieve the goal of biasing a selected WL.

In some embodiments, the resistance of the resistance device 250 is adjustable. FIGS. 3B-3C illustrates examples of 2-bits adjustable resistance devices 300B and 300C using a combination of transistors and resistors according to the principles described herein. Referring to FIG. 3B, the resistance device 300B includes two bypass transistors 312B, 314B and four resistors 322B, 324B, 326B, and 328B, each having a resistance of R. Each of the bypass transistors 312B, 314B can be turned on or off by a trim code input at their respective gate terminal, causing the current to bypass one or more of the resistors 322B, 324B, 326B, and 328B. For example, the trim code input at the gate terminal of the bypass transistor 312B is represented as trim <1>, and the trim code input at the gate terminal of the bypass transistor 314B is represented as trim <0>. As shown in the table in FIG. 3B, when trim <1> and trim <0> both have an input code 1 (i.e., both bypass transistors 312B, 314B are turned on), the resistance of the resistance device 300B is R; when trim <1> has an input code 1 (i.e., bypass transistor 312B is turned on), and trim <0> has an input code 0 (i.e., bypass transistor 314B is turned off), the resistance of the resistance device 300B is 2R; when trim <1> has an input code 0 (i.e., bypass transistor 312B is turned off) and trim <0> has an input code 0 (i.e., bypass transistor 314B is turned on), the resistance of the resistance device 300B is 3R; and when both trim <1> and trim <0> have an input code 0 (i.e., both bypass transistors 312B and 314B are turned off), the resistance of the resistance device 300B is 4R.

FIG. 3C illustrates another 2-bits adjustable resistance device 300C using 2-bits trim codes to adjust the resistance thereof. The resistance device 300C includes two bypass transistors 312C, 314C, and four MOS transistors 322C, 324C, 326C, 328C functioning as resistors, each having a resistance R. Similar to the resistance device 300B, the resistance device 300C can also adjust the resistance of itself using 2-bits trim code to turn on or off the bypass transistors 312C and 314C. Note, the MOS transistors 322C, 324C, 326C, 328C may be replaced with other resistance devices, such as poly resistors, diffusion resistors, well resistors, or any other resistance devices supported by technology. Further, more or fewer bypass transistors and resistors may be implemented to allow more or fewer combinations of resistance for the adjustable resistance device.

In some embodiments, the resistance of the resistance device 250 is determined based on the required leakage reduction. Based on the required leakage reduction, an amount of source terminal bias ($V_{sl}$) can be determined. The resistance of the resistance device 250 can then be determined based on the read current and the source terminal bias. For example, assuming 100 times leakage reduction is required, 250 mV is required for 100 times leakage reduction, and 50 µA is the read current, the resistance R of the resistance device 250 can be computed as $V_{sl}/I_{read}$=150 mV/50 µA=3000 ohm.

Figure 4:
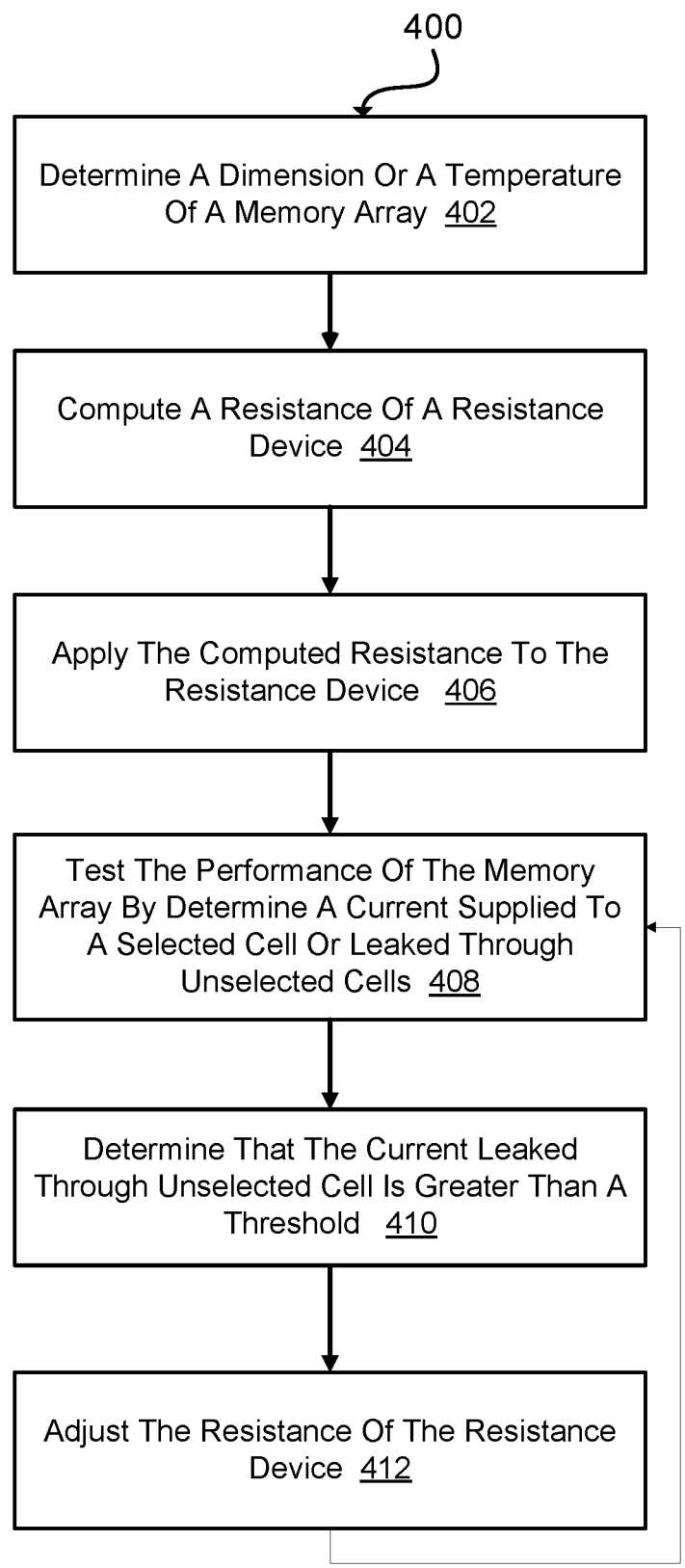
FIG. 4 illustrates a flowchart of a method for computing or adjusting resistance of a resistance device according to one embodiment.

FIG. 4 illustrates a flowchart of a method 400 for computing or adjusting resistance of a resistance device (e.g., resistance device 250) according to one embodiment. The method 400 includes identifying 402 a dimension and/or a temperature of the memory array, and computing 404 a resistance of the resistance device responsive to the identified dimension of the memory array and/or the temperature of the memory array. The computed resistance is applied 406 to the resistance device of the memory array. After applying the resistance device of the memory array, the memory array can be tested 408 to determine a current supplied to a selected cell and/or a current leaked through unselected cells. The process determines 410 whether the current leaked through the unselected cells is greater than a threshold. For example, the determination may be based on whether the current supplied to the selected cell is lower than a threshold, whether the current leaked through the unselected cells is greater than a threshold, and/or whether a ratio between the current supplied to the selected cell and the current leaked through the unselected cells is greater than a threshold. Responsive to a determination that the current leaked through the unselected cells is greater than the threshold, the resistance of the resistance device is adjusted 412 accordingly. The steps 408 through 412 may be repeat as often as necessary to further adjust the resistance of the resistance device until a desired resistance level is achieved.

In some embodiments, the memory device may include a resistance adjustment module configured to adjust the resistance of the resistance device. The method 400 is performed by the resistance adjustment module. In some embodiments, the resistance may be adjusted based on the temperature. In some embodiments, the memory device further includes a temperature detection module configured to detect the temperature of the memory device. In some embodiments, responsive to detecting that the temperature of the memory device is greater than a threshold, the resistance adjustment module increases the resistance of the resistance device.

In some embodiments, the method 400 is performed by simulation software during design of a memory device. The simulation software is configured to compute a resistance of the resistance device based on a determined Vgs at a determined temperature.

Figure 5:
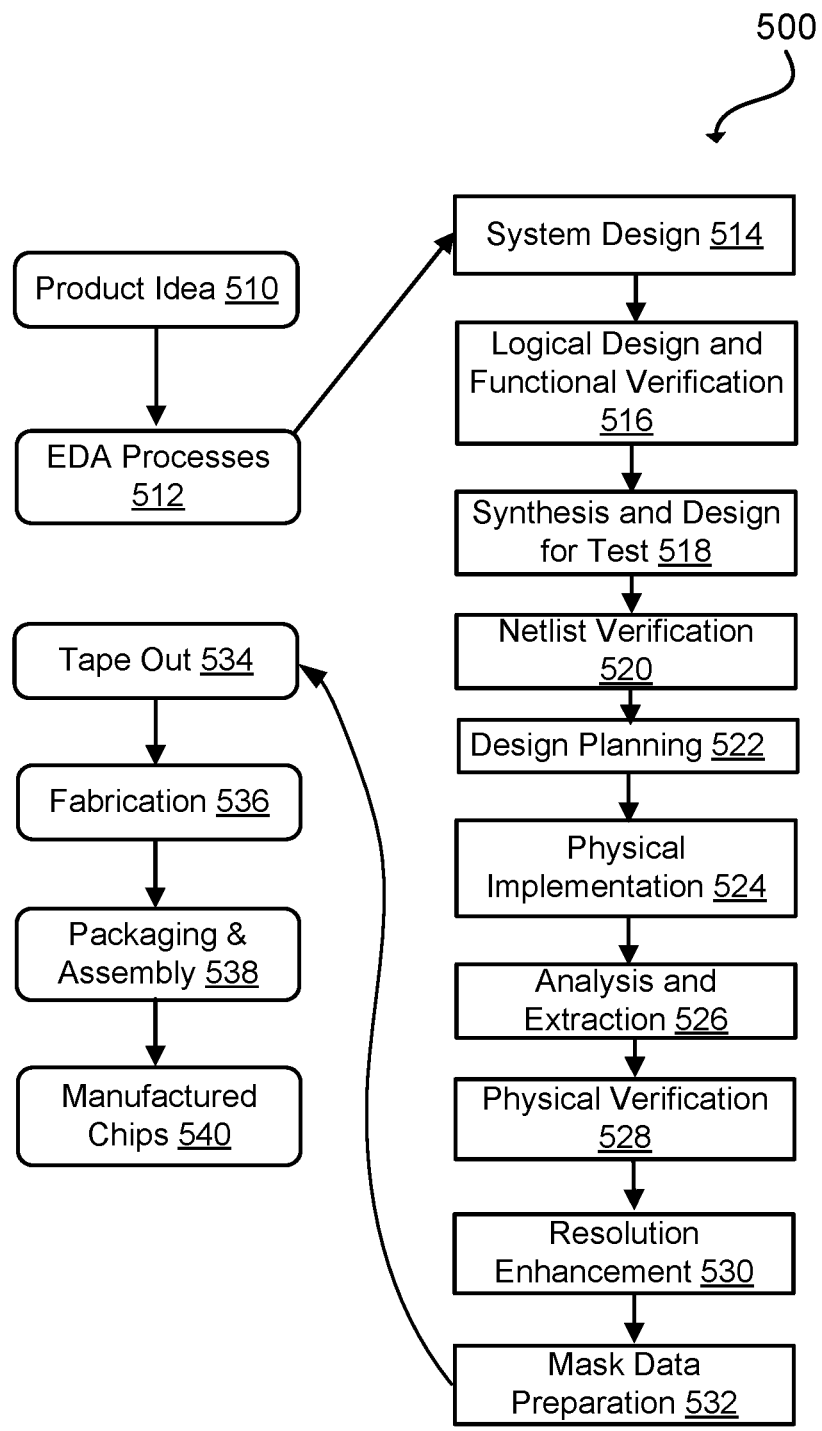
FIG. 5 depicts a flowchart of various processes used during the design and manufacture of an integrated circuit in accordance with some embodiments of the present disclosure.

The disclosed configuration may be applied for design and/or manufacture of a memory device. Once designed, the memory device may be designed as a silicon intellectual property block and/or manufactured as a device using an electronic automation design process. FIG. 5 illustrates an example set of processes 500 used during the design, verification, and fabrication of an article of manufacture such as an integrated circuit (e.g., a memory device described herein) to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 5. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

Figure 6:
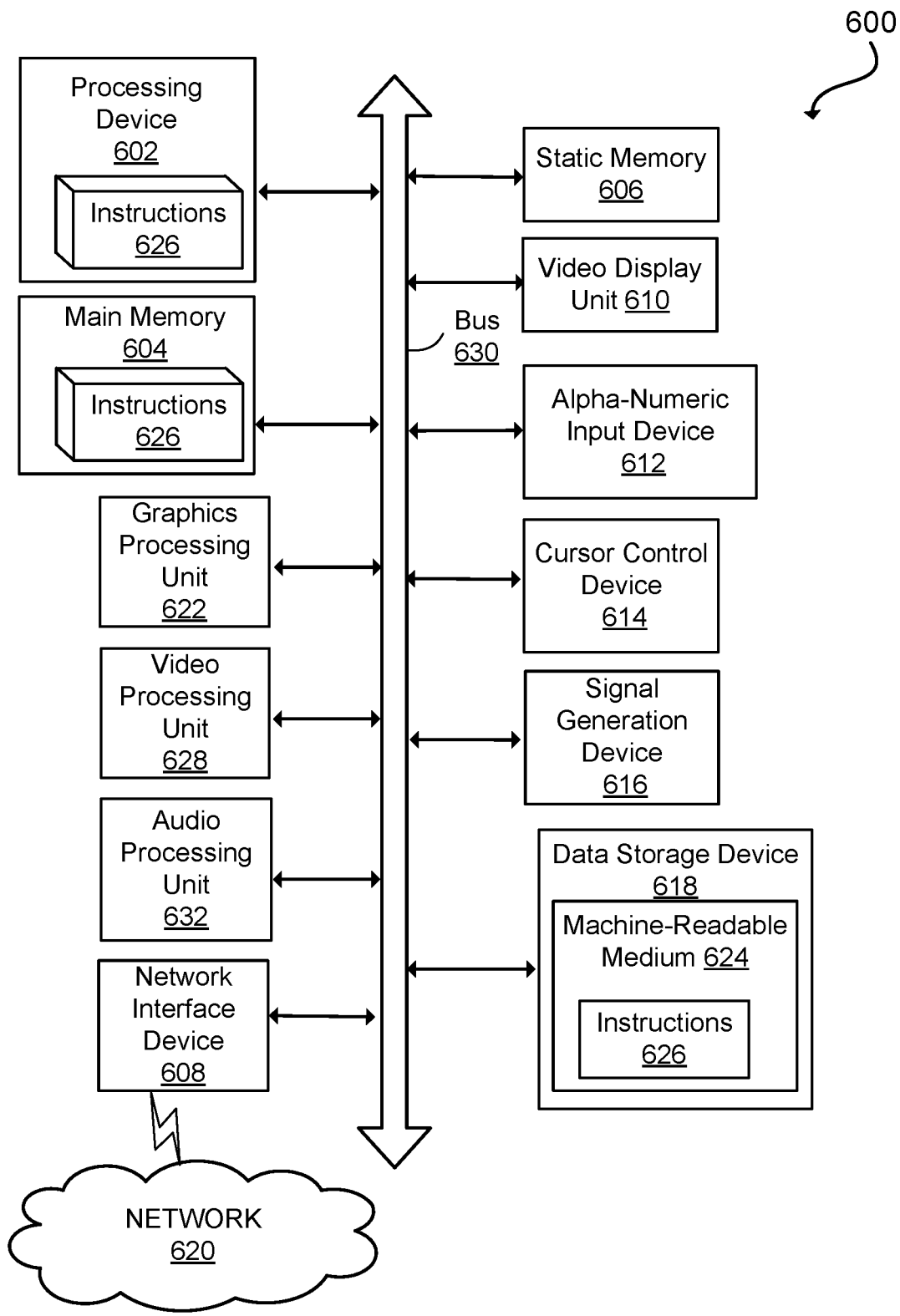
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A memory device comprising:
a plurality of select lines;
a plurality of word lines;
a plurality of memory cells, having a plurality of rows and a plurality of columns;
a bitline structured to receive a current in a read operation, causing a value stored in a selected memory cell of the plurality of memory cells to be readable when a select line of the plurality of select lines and a word line of the plurality of word line that intersect the selected memory cell are both selected; and
a resistance device having a first terminal and a second terminal, wherein:
the first terminal of the resistance device is coupled to each of the plurality of select lines,
the second terminal of the resistance device is coupled to ground, and
the resistance device is to bias, in read operations, word lines of unselected memory cells to a determined negative voltage,
wherein during a first read option, a first memory cell at an intersection of a first word line and a first select line is selected, the resistance device is configured to bias word lines of unselected memory cells along the first select line, and
wherein during a second read option, a second memory cell at an intersection of a second word line and a second select line, different from the first word line and the first select line respectively, is selected, the resistance device is configured to bias word lines of unselected memory cells along the second select line, wherein a resistance of the resistance device is computed based on one or more of: (1) a ratio of leakage reduction and required bias voltage, or (2) read current of the memory device.

2. The memory device of claim 1, wherein the memory device is a resistance based memory device that depends upon changes of resistance to store values in memory cells.

3. The memory device of claim 1, wherein the memory device is one of (i) a phase change memory (PCM), (ii) a magnetoresistive random access memory (MRAM), or (iii) a resistive random access memory (RRAM).

4. The memory device of claim 1, wherein each memory cell comprises:
   a MOS transistor having a gate terminal, a source terminal, and a drain terminal;
   a variable resistor having a first terminal and a second terminal, wherein:
      the gate terminal of the MOS transistor is connected to a corresponding word line,
      the drain terminal of the MOS transistor is connected to the first terminal of the variable resistor,
      the source terminal of the MOS transistor is connected to the select line,
      the second terminal of the variable resistor is connected to the bitline, and
      the resistance device causes a voltage of the select line to be raised to a determined voltage (+V), which in turn causes a voltage between the gate terminal and the source terminal of the MOS transistor to be the determined negative voltage (−V).

5. The memory device of claim 1, wherein the determined negative voltage (−V) is about negative 100 mV to 200 mV.

6. The memory device of claim 1, wherein the memory device includes at least one of a resistor, a metal-insulator-semiconductor (MOS) transistor, a polycrystalline silicon (Poly) transistor, an oxide diffusion (OD) area, a nanowire (NW) transistor, or a combination thereof.

7. The memory device of claim 1, wherein a resistance of the resistance device is computed based on a ratio of leakage reduction and required bias voltage.

8. The memory device of claim 1, wherein a resistance of the resistance device is computed based on read current of the memory device.

9. The memory device of claim 8, wherein when a number of memory cells in the column is 1024, a resistance of the resistance device is about 4000 ohm.

10. The memory device of claim 1, wherein a resistance of the resistance device is adjustable.

11. The memory device of claim 10, wherein the memory device further comprises a resistance adjustment module configured to adjust the resistance of the resistance device based on a temperature of the memory device.

12. The memory device of claim 11, wherein the memory device further comprises a temperature detection module configured to detect the temperature of the memory device, and responsive to detecting that the temperature of the memory device is greater than a threshold, the resistance adjustment module increases the resistance of the resistance device.

13. A non-transitory computer readable medium comprising instructions, which when executed by a processing device, cause the processing device to instantiate a digital representation of a memory device, the digital representation of the memory device comprising:

a plurality of select lines;
a plurality of word lines;
a plurality of memory cells, having a plurality of rows and a plurality of columns;
a bitline structured to receive a current in a read operation, causing a value stored in a selected memory cell of the plurality of memory cells to be readable when a select line of the plurality of select lines and a word line of the plurality of word lines that intersect the selected memory cell are both selected; and
a resistance device having a first terminal and a second terminal; and
a resistance device having a first terminal and a second terminal, wherein:
   the first terminal of the resistance device is coupled to each of the plurality of select lines,
   the second terminal of the resistance device is coupled to ground, and
   the resistance device is to bias, in read operations, word lines of unselected memory cells to a determined negative voltage,
   wherein during a first read option, a first memory cell at an intersection of a first word line and a first select line is selected, the resistance device is configured to bias word lines of unselected memory cells along the first select line, and
   wherein during a second read option, a second memory cell at an intersection of a second word line and a second select line, different from the first word line and the first select line respectively, is selected, the resistance device is configured to bias word lines of unselected memory cells along the second select line,
   wherein a resistance of the resistance device is computed based on one or more of: (1) a ratio of leakage reduction and required bias voltage, or (2) read current of the memory device.

14. The non-transitory computer readable medium of claim 13, wherein the memory device is a resistance based memory device that depends upon changes of resistance to store values in memory cells.

15. The non-transitory computer readable medium of claim 13, wherein the memory device is one of (i) a phase change memory (PCM), (ii) a magnetoresistive random access memory (MRAM), or (iii) a resistive random access memory (RRAM).

16. The non-transitory computer readable medium of claim 13, wherein each memory cell comprises:
   a MOS transistor having a gate terminal, a source terminal, and a drain terminal;
   a variable resistor having a first terminal and a second terminal, wherein:
      the gate terminal of the MOS transistor is connected to a corresponding word line,
      the drain terminal of the MOS transistor is connected to the first terminal of the variable resistor,
      the source terminal of the MOS transistor is connected to the select line,
      the second terminal of the variable resistor is connected to the bitline, and
      the resistance device causes a voltage of the select line to be raised to a determined voltage (+V), which in turn causes a voltage between the gate terminal and the source terminal of the MOS transistor to be the determined negative voltage (−V).

17. The non-transitory computer readable medium of claim 13, wherein the determined negative voltage (−V) is about negative 100 mV to 200 mV.

18. The non-transitory computer readable medium of claim 13, wherein the memory device includes at least one of a resistor, a metal-insulator-semiconductor (MOS) transistor, a polycrystalline silicon (Poly) transistor, an oxide diffusion (OD) area, a nanowire (NW) transistor, or a combination thereof.

19. The non-transitory computer readable medium of claim 13, wherein a resistance of the resistance device is computed based on a ratio of leakage reduction and required bias voltage.

20. The non-transitory computer readable medium of claim 13, wherein a resistance of the resistance device is computed based on read current of the memory device.

\* \* \* \* \*